United States Patent
Hong et al.

(10) Patent No.: US 7,636,654 B2
(45) Date of Patent: Dec. 22, 2009

(54) DIFFERENTIAL AMPLIFIER AND METHOD FOR GENERATING COMPUTER SIMULATION MODEL THEREOF

(75) Inventors: Songcheol Hong, Daejeon (KR); Dong Ho Lee, Daejeon (KR); Kyung-Ai Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 640 days.

(21) Appl. No.: 11/260,159

(22) Filed: Oct. 28, 2005

(65) Prior Publication Data

US 2006/0226906 A1    Oct. 12, 2006

(30) Foreign Application Priority Data

Apr. 6, 2005   (KR) .................... 10-2005-0028505

(51) Int. Cl.
   *G06F 17/50*   (2006.01)
(52) U.S. Cl. ...................... 703/15; 703/14; 330/252
(58) Field of Classification Search ............ 703/13–15, 703/2; 330/252, 259, 261; 716/4
   See application file for complete search history.

(56) References Cited

U.S. PATENT DOCUMENTS 4,504,794 A    3/1985   Fenk
4,714,896 A   12/1987   Addis

OTHER PUBLICATIONS

Duncan, B. Topologies, Class and Modes High Performance Audio Power Amplifiers, Sciencedirect, 1996, pp. 83-168.*

* cited by examiner

*Primary Examiner*—Russell Frejd
(74) *Attorney, Agent, or Firm*—Oliff & Berridge, PLC

(57) ABSTRACT

A differential amplifier and a method for generating a computer simulation model thereof are disclosed. The device is thermally stable through adoption of a ballast resistor to a differential structure of a unit transistor pair, such that the differential amplifier prevents heat effect phenomena, such as performance deterioration and device destruction by heating, and, at the same time, improves or maintains other performances, thereby achieving high gain, high efficiency, high linearity, and wide bandwidth characteristics. Therefore, the differential amplifier can be easily designed as undesired effects of parasitic resistor of emitter or via or bonding wire, etc. for the differential amplifier are reduced in a differential mode.

8 Claims, 8 Drawing Sheets

DIFFERENTIAL AMPLIFIER AND METHOD FOR GENERATING COMPUTER SIMULATION MODEL THEREOF

BACKGROUND OF THE INVENTION

1. Field of the Invention

The present invention relates to amplifier technology, and more particularly to a differential amplifier which is thermally stable by adopting a ballast resistor to a differential structure of a unit transistor pair, such that the differential amplifier prevents heat effect phenomena, such as performance deterioration and device destruction by heating, and, at the same time, improves or maintains other performance traits, thereby achieving high gain, high efficiency, high linearity, and wide bandwidth characteristics, and a method for generating a computer simulation model of the differential amplifier.

2. Description of the Related Art

Generally, an amplifier is designed to obtain high output power and high efficiency. When high output power is an objective, a large amount of heat is inevitably generated inside an amplifier, such that the heat causes performance deterioration or destruction of unit transistors.

Especially, since bipolar transistors have a thermal characteristic of positive feedback, in a power amplifier designed by connecting a plurality of transistors, a large amount of heat is generated at the middle portion, in which transistors are more tightly packed, than at the edge. Also, since turn-on voltage at a relatively high temperature is lowered due to positive feedback and larger currents are generated in the middle of the power amplifier, a large amount of heat is generated therein.

As such a feedback is repeated, temperature of the transistors in the middle of the power amplifier is increased, and a large amount of current flows therethrough, such that the power amplifier suffers complete failure, finally resulting in complete destruction of the transistors.

In order to prevent such an outcome, each unit transistor forming an amplifier employs a ballast resistor to have negative feedback characteristics, such that thermal equilibrium can be maintained among unit cells, thereby protecting the transistors from destruction.

FIG. 1 is a view illustrating a circuit of an amplifier according to the prior art, in which each unit cell 15 includes a transistor 13 and a ballast resistor 14, which is connected to the emitter of the transistor 13, and thus forms thermally negative feedback. Therefore, the amplifier prevents heat-induced performance deterioration and device destruction.

However, since such a ballast resistor 14, employed in each cell to form thermally negative feedback, forms electrically negative feedback as well as thermally negative feedback, gain and efficiency of the amplifier are decreased.

FIG. 2 is a view illustrating a circuit of an amplifier according to another embodiment of the prior art, in which each unit cell 27 includes a unit transistor 24, a capacitor 26 connected to the base of the transistor 24 to transfer an RF signal to the base and a ballast resistor 25 located between a node, which is positioned between the capacitor 26 and the base, and DC voltage lead 22. Therefore, the amplifier prevents loss of an RF signal and is thermally stable through the DC bias path including the ballast resistor 25.

However, the prior art amplifier has disadvantages in that frequency bandwidth of the amplifier is decreased by such a capacitor, which is serially connected to the base to separate the RF signal path from the DC bias path, and also, its size is enlarged due to the capacitors.

SUMMARY OF THE INVENTION

Therefore, the present invention has been made in view of the above problems, and it is an object of the present invention to provide a differential amplifier which is thermally stable by adopting a ballast resistor to a differential structure of a unit transistor pair, such that the differential amplifier prevents heat effect phenomena, such as performance deterioration and device destruction, and, at the same time, improves or maintains other performances, thereby achieving high gain, high efficiency, high linearity, and wide bandwidth characteristics, and a method for generating a computer simulation model of the differential amplifier.

In accordance with the present invention, the above and other objects can be accomplished by the provision of a differential amplifier comprising a plurality of unit cells which are connected to each other in parallel, wherein each unit cell includes a unit transistor pair, which is formed as a differential structure, and a ballast resistor which is connected to common emitter of the unit transistor pair.

Preferably, the device inputs differential inputs and outputs differential outputs.

In accordance with another aspect of the present invention, there is provided a method for generating a computer simulation model of a differential amplifier comprising a plurality of unit cells which are connected to each other in parallel, wherein the unit cell includes a unit transistor pair, which is formed as a differential structure, and a ballast resistor which is connected to common emitter of the unit transistor pair. The method comprising the steps of: extracting DC characteristics and thermal characteristics based on a common mode pattern which is formed through interconnection of bases of the unit cells and interconnection of collectors of the unit cells; extracting electrical characteristics by a half amplifier pattern which is formed as one side differential transistors of unit cells and emitter ballast resistors are connected to each other in parallel; extracting emitter resistance and parasitic components by common emitter ballast resistor pattern which is formed as emitter ballast resistors of the unit cells are connected to each other in parallel; and modeling a differential amplifier as a single unit cell based on the extracted values which are obtained through the common mode pattern, the half amplifier pattern, and the common emitter ballast resistor pattern.

Preferably, the unit common emitter ballast resistance of the unit cell is extracted from the unit common emitter ballast resistor pattern, and the total common emitter ballast resistance is derived by dividing the unit common emitter ballast resistor by the number of unit cells.

The present invention, constructed as mentioned above, is thermally stable by adoption of a ballast resistor to a differential structure of a unit transistor pair, such that the differential amplifier prevents heat effect phenomena, such as performance deterioration and device destruction by heating, and, at the same time, improves or maintains other performances, thereby achieving high gain, high efficiency, high linearity, and wide bandwidth characteristics. Also, the present invention provides a computer simulation model enabling precise design of the differential amplifier.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Referring to attached drawings, preferred embodiments of the present invention are described in detail. The embodiments of the present invention do not limit the scope of the present invention but are directed to explanation of the present invention.

Figure 1:
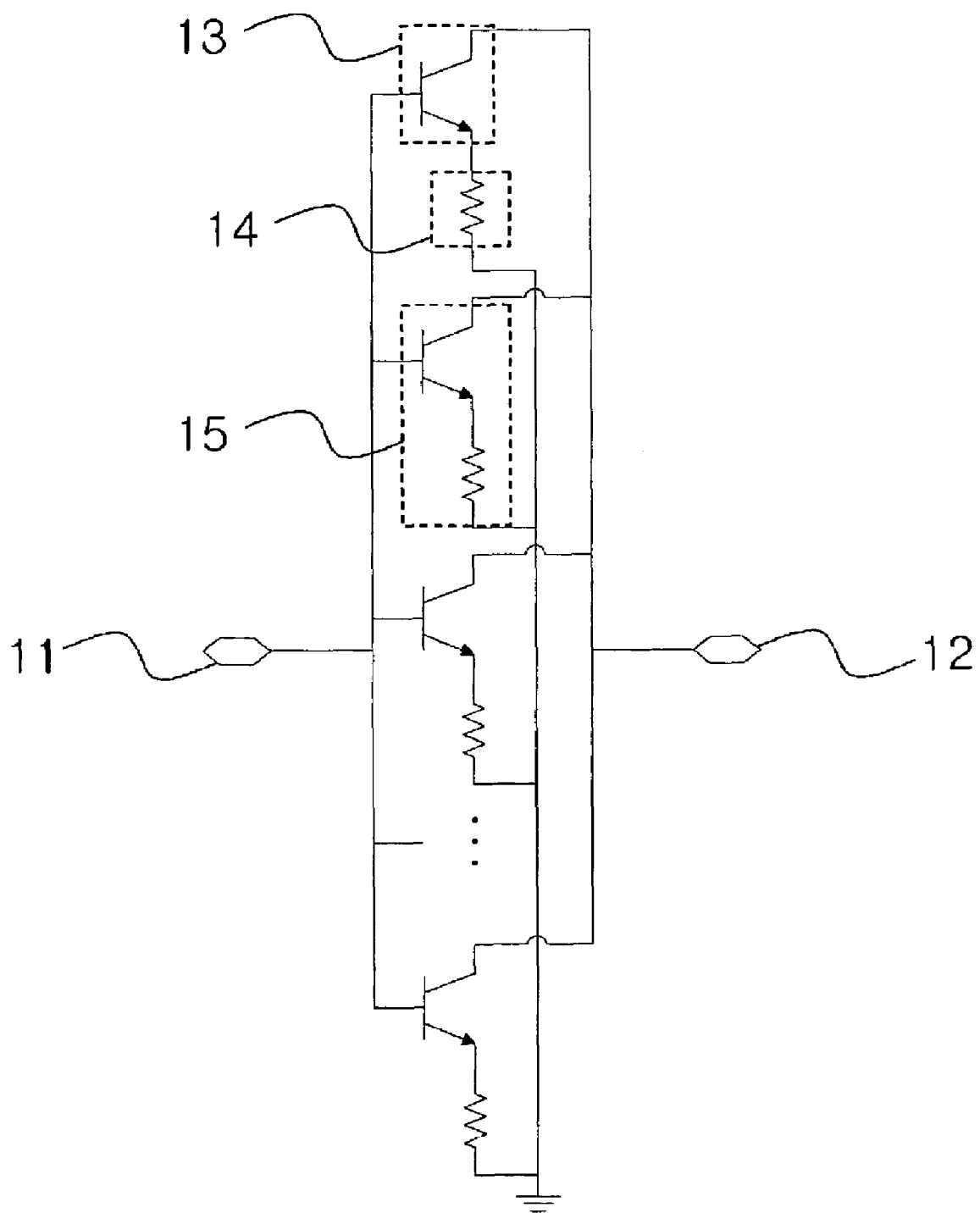
FIG. 1 is a view illustrating a circuit of an amplifier according to the prior art.
Figure 2:
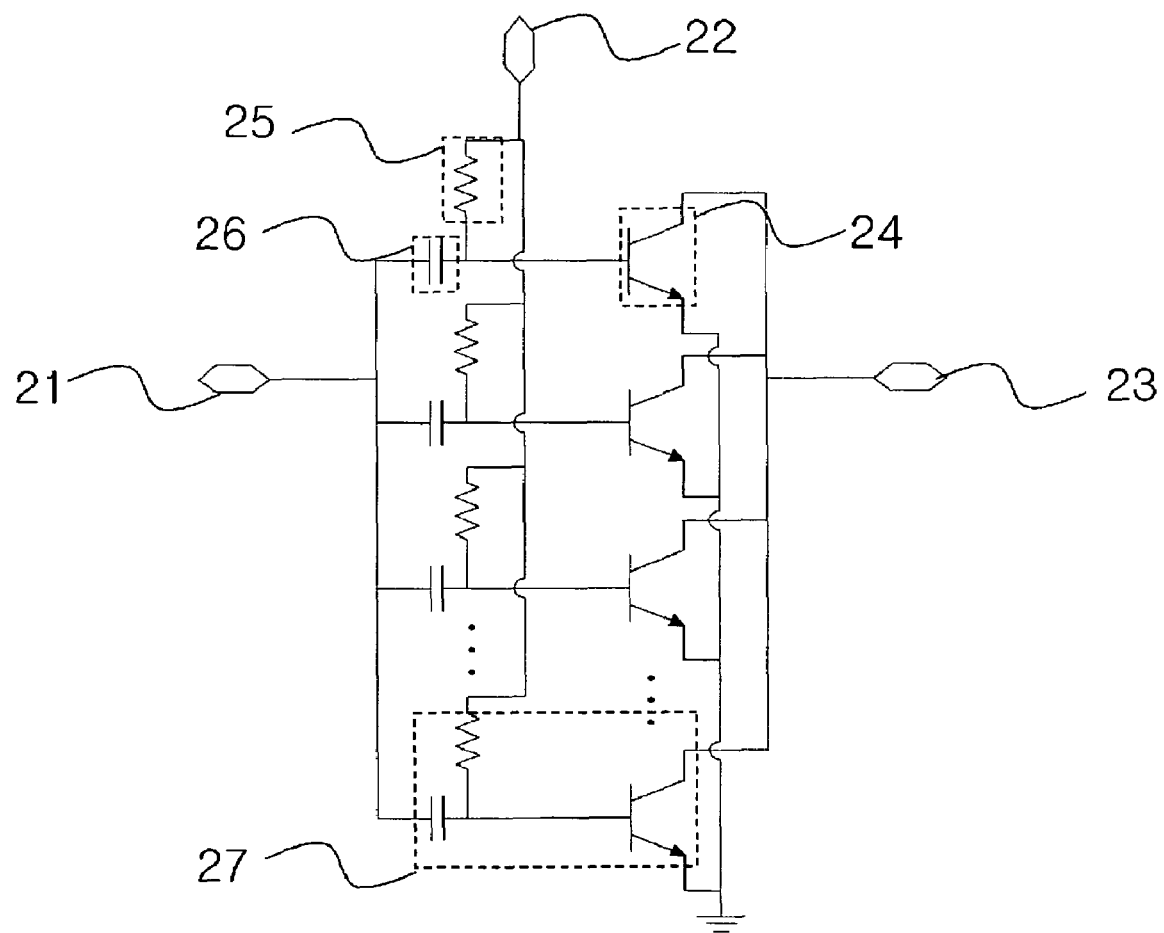
FIG. 2 is a view illustrating a circuit of an amplifier according to another embodiment of the prior art.
Figure 3:
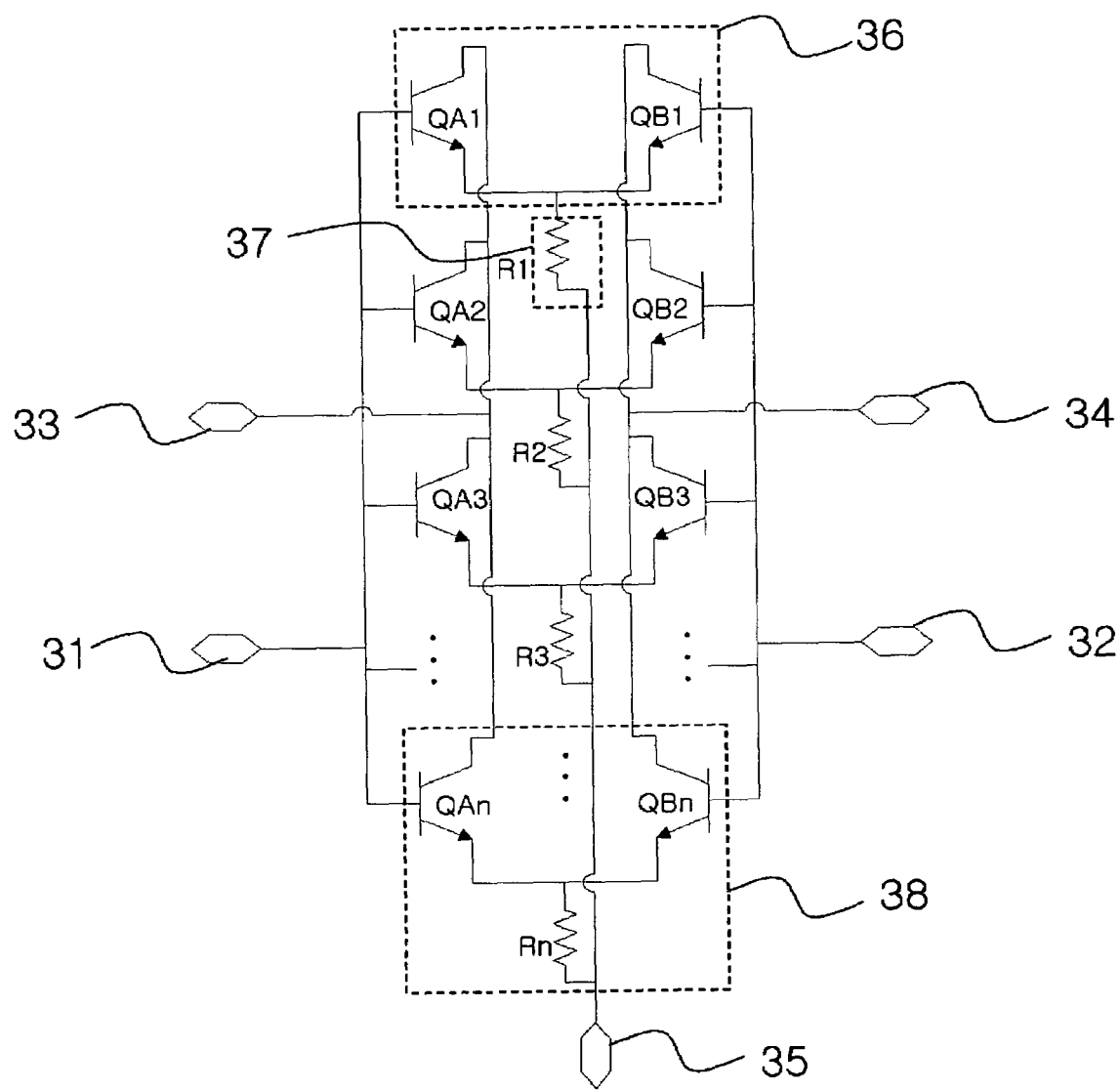
FIG. 3 is a view illustrating a circuit of a differential amplifier according to the present invention.

FIG. 3 is a view illustrating a circuit of a differential amplifier according to the present invention.

As shown in FIG. 3, the differential amplifier is configured such that plural unit cells 38 are connected to each other in parallel, in which each unit cell 38 is configured as common emitters of each of unit transistor pairs 36 comprising unit transistors (QA1~Qan and QB1~QBn) are connected to one end of each of ballast resistors (R1~Rn). Here, each unit transistor pair has a differential structure 36.

When the differential amplifier is operated in a differential mode, since the common emitter ballast resistors (R1~Rn) 37 do not affect the RF signal, gain of the amplifier is not decreased. Rather, since the ballast resistors 37 assist in common mode rejection, linearity is improved by removing even harmonics.

Also, regarding heat effect by DC current, since each cell 38 includes the ballast resistors (R1~Rn) 37 each of which is connected to the common emitter, thermal equilibrium is maintained among cells, thereby preventing performance deterioration and device destruction by heating.

As such, the differential amplifier according to the present invention has advantages in that gain and efficiency are maintained in thermal equilibrium, and linearity is improved. Also, since a capacitor or other electrical components are not required, the entire circuit size is relatively small, and frequency bandwidth can be extended.

Now, a method for generating a computer simulation model, which is capable of estimating precise result value, is described, in order to apply the value to design of the differential amplifier according to the present invention.

Figure 4:
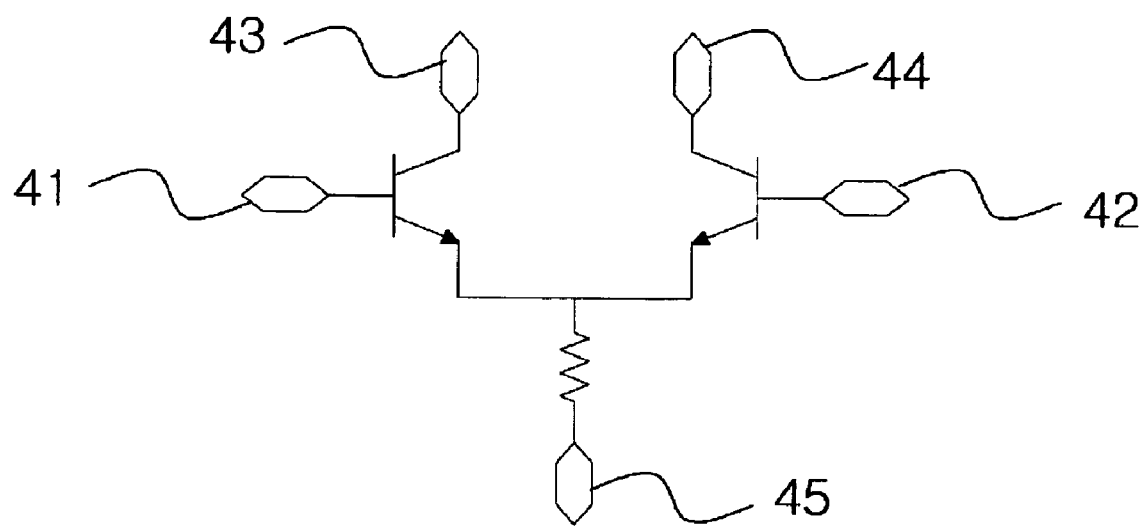
FIG. 4 is a view illustrating a computer simulation model of a differential amplifier according to the present invention.
Figure 5:
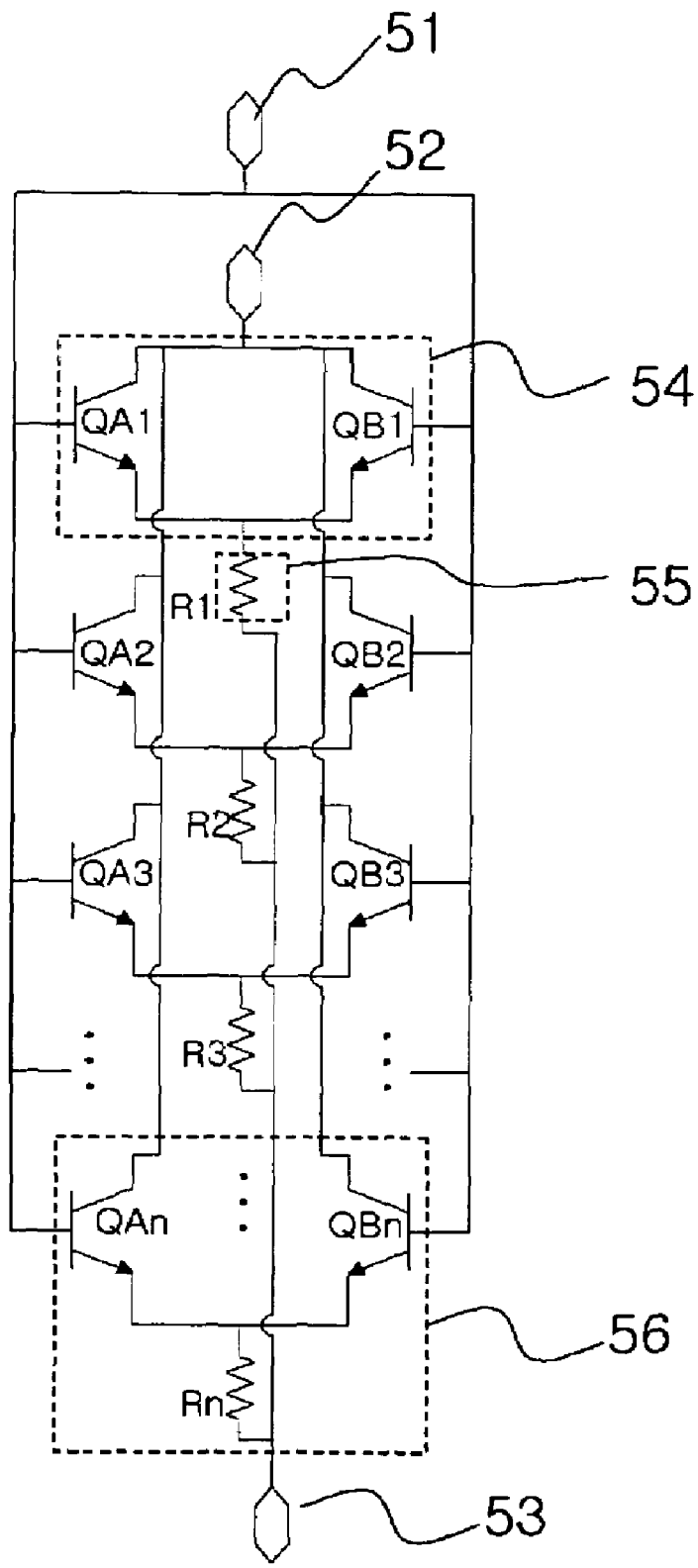
FIG. 5 is a view illustrating a common mode pattern for generating a computer simulation model of a differential amplifier according to the present invention.
Figure 6:
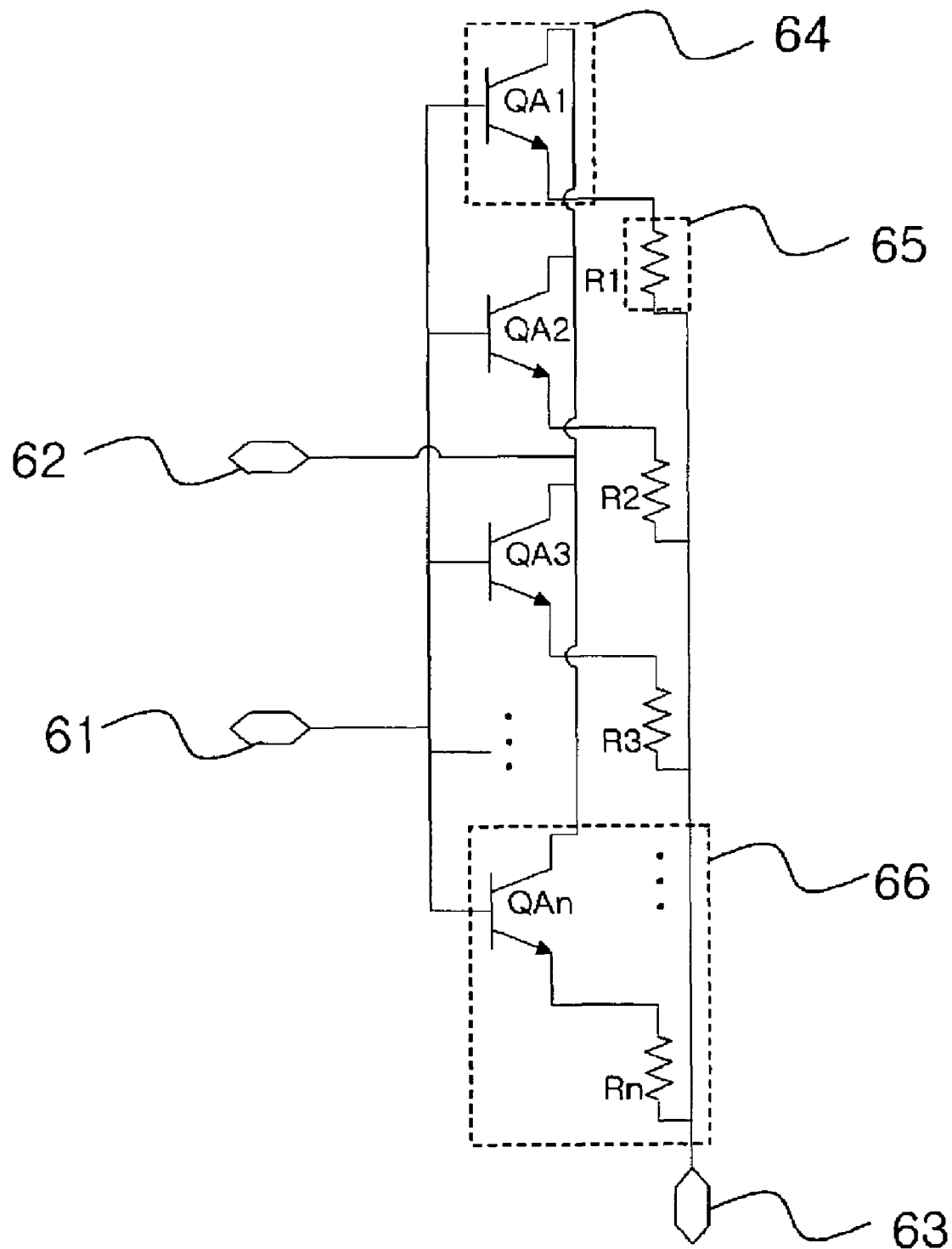
FIG. 6 is a view illustrating a half amplifier pattern for generating a computer simulation model of a half amplifier according to the present invention.
Figure 7:
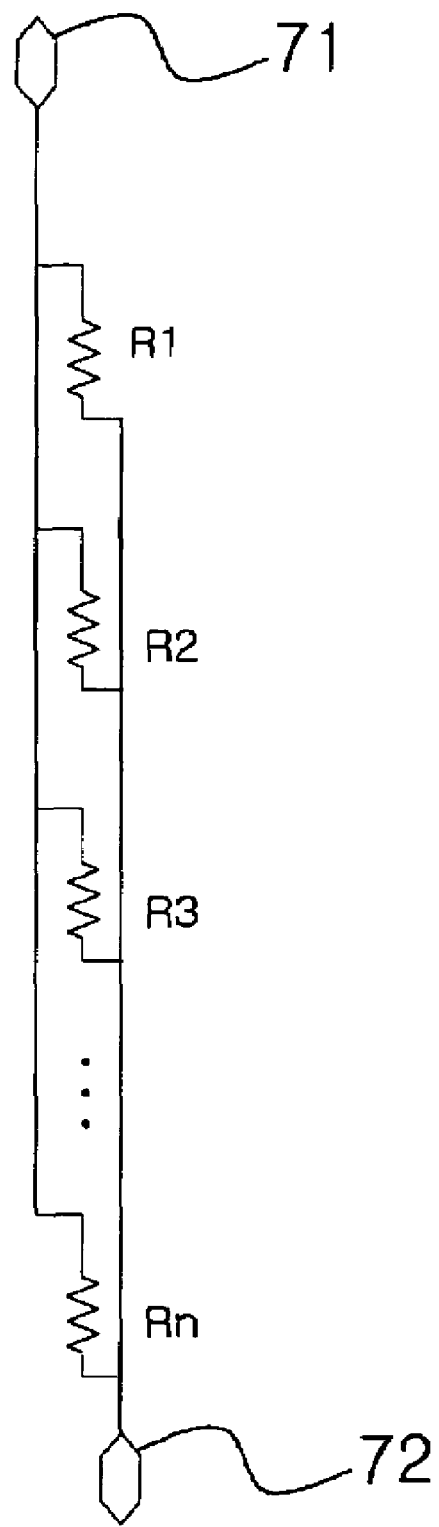
FIG. 7 is a view illustrating a pattern of an total common emitter ballast resistor which is connected in parallel for generating a computer simulation model of a differential amplifier according to the present invention.
Figure 8:
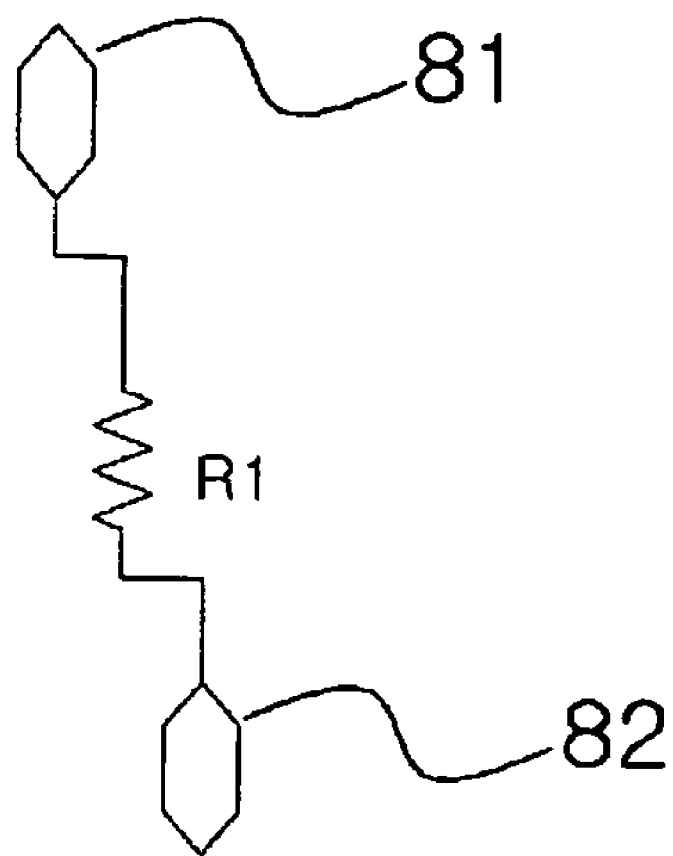
FIG. 8 is a view illustrating a pattern of a unit common emitter ballast resistor for generating a computer simulation model of a differential amplifier according to the present invention.

FIG. 4 is a view illustrating a computer simulation model of a differential amplifier according to the present invention. FIG. 5 is a view illustrating a common mode pattern for generating a computer simulation model of a differential amplifier according to the present invention. FIG. 6 is a view illustrating a half amplifier pattern for generating a computer simulation model of a half amplifier according to the present invention. FIG. 7 is a view illustrating a pattern of an entire common emitter ballast resistor which is connected in parallel for generating a computer simulation model of a differential amplifier according to the present invention. FIG. 8 is a view illustrating a pattern of a unit common emitter ballast resistor for generating a computer simulation model of a differential amplifier according to the present invention.

As shown in FIG. 4, the differential amplifier according to the present invention, which includes a plurality of unit cells 38 which are connected to each other in parallel, is simplified into a single differential amplifier of a unit cell as a model for a computer simulation. Here, each of the unit cells 38 is configured such that common emitters of each of unit transistor pairs 36 comprising unit transistors (QA1~Qan and QB1~QBn), in which each unit transistor pair has a differential structure 36, are connected to one end of each of ballast resistors (R1~Rn).

However, such a model does not take into account parasitic components. Therefore, when the model is applied to real-world devices, other parasitic components are added thereto.

As shown in FIG. 3, although the differential amplifier according to the present invention is configured such that a plurality of unit cells are connected to each other in parallel, since it is difficult to obtain electric characteristics and heat effects of every unit cell and then add them, the differential amplifier of FIG. 3 is modeled into a single differential amplifier having a single unit cell, as shown in FIG. 4.

For modeling, as shown in FIG. 5, bases 51 of the unit cells 56 are connected to one another and collectors 52 of the unit cells 56 are also connected to one another, such that a common mode pattern can be formed, and then DC characteristics and thermal characteristics can be extracted.

After that, as shown in FIG. 6, electrical characteristics are extracted as a half amplifier pattern is formed, in which the half amplifier pattern is formed as cells 66, each of which includes a transistor 64 and an emitter ballast resistor 65, are connected to each other in parallel. More specifically, the cells 66 include the transistors 64, each of which is located at one side of the differential transistors of the unit cells, and the emitter ballast resistors 65. Also, as shown in FIG. 7, emitter resistance and parasitic components are extracted from a common emitter ballast resistor pattern in which emitter ballast resistors (R1~Rn) of the unit cells are connected to each other in parallel.

Here, a method for extracting resistance of the emitter ballast resistor, as shown in FIG. 7, is simply performed as the entire resistance of the parallel resistors is measured one time. However, measurement error can be increased since resistance of parallel resistors is so small, because the resistance of the emitter ballast resistor is generally small, for example, a few ohms. Alternatively, as shown in FIG. 8, a unit common emitter ballast resistor R1 is measured and then the entire resistance of the parallel resistors may be derived therefrom.

As such, through the common mode pattern, the half amplifier pattern, and common emitter ballast resistor patterns, transistor parameters, emitter resistance and parasitic components are extracted. After that, a differential amplifier is modeled on the basis of the extracted value, and then computer simulation is performed based on the model, thereby obtaining a precise value.

As apparent from the above description, the present invention provides a differential amplifier having advantages in that it is thermally stable through adoption of a ballast resistor to a differential structure of a unit transistor pair, such that the differential amplifier prevents heat effect phenomena, such as performance deterioration and device destruction by heating, and, at the same time, improves or maintains other performances, thereby achieving high gain, high efficiency, high linearity, and wide bandwidth characteristics, and a method for generating a computer simulation model of the differential amplifier.

Since the ballast resistors assist in common mode rejection, linearity is improved by removing even harmonics. Also, the differential amplifier can be easily designed as undesired effects from parasitic resistance of emitter or via or bonding wire, etc. are reduced in a differential mode.

Furthermore, overall size of the differential amplifier is relatively small, compared with prior art amplifiers. On the other hand, frequency bandwidth of the differential amplifier is extended.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A differential amplifier comprising a plurality of unit cells which are connected to each other in parallel, wherein the unit cell includes a unit transistor pair, which is formed as a differential structure, and a ballast resistor which is connected to a common emitter of the unit transistor pair.

2. The device as set forth in claim 1, wherein the device inputs differential inputs and outputs differential outputs.

3. A method for generating a computer simulation model of a differential amplifier comprising a plurality of unit cells which are connected to each other in parallel, wherein the unit cell includes a unit transistor pair, which is formed as a differential structure, and a ballast resistor which is connected to a common emitter of the unit transistor pair, the method comprising the steps of:
   preparing a differential amplifier comprising a plurality of unit cells which are connected to each other in parallel, wherein the unit cell includes a unit transistor pair which is formed as a differential structure, and a ballast resistor which is connected to a common emitter of the unit transistor pair;
   extracting DC characteristics and thermal characteristics based on a common mode pattern which is formed as bases of the unit cells are connected to each other and collectors of the unit cells are connected to each other;
   extracting electrical characteristics by a half amplifier pattern which is formed as one side differential transistors of unit cells and emitter ballast resistors are connected to one another in parallel;
   extracting emitter resistance and parasitic components by a common emitter ballast resistor pattern which is formed as emitter ballast resistors of the unit cells are connected to each other in parallel; and
   modeling a differential amplifier as a single differential amplifier of a unit cell based on the extracted values which are obtained through the common mode pattern, the half amplifier pattern, and the common emitter ballast resistor pattern.

4. The method as set forth in claim 3, wherein emitter resistance and parasitic components are derived by dividing the resistance and the parasitic components, which are measured from a unit common emitter ballast resistor pattern, by the number of the total unit cells.

5. A method for extracting DC characteristics and thermal characteristics of a differential amplifier comprising a plurality of unit cells which are connected to each other in parallel, wherein the unit cell includes a unit transistor pair, which is formed as a differential structure, and a ballast resistor which is connected to a common emitter of the unit transistor pair,
   the method comprising the steps of: preparing a differential amplifier comprising a plurality of unit cells which are connected to each other in parallel, wherein the unit cell includes a unit transistor pair, which is formed as a differential structure, and a ballast resistor which is connected to a common emitter of the unit transistor pair; extracting the DC characteristics and thermal characteristics based on a common mode pattern which is formed as bases of the unit cells are connected to each other and collectors of the unit cells are connected to each other and modeling a differential amplifier as a single differential amplifier of a unit cell based on the extracted values which are obtained through the common mode pattern.

6. A method for extracting electrical characteristics of a differential amplifier comprising a plurality of unit cells which are connected to each other in parallel, wherein the unit cell includes a unit transistor pair, which is formed as a differential structure, and a ballast resistor which is connected to a common emitter of the unit transistor pair,
   the method comprising the steps of: preparing a differential amplifier comprising a plurality of unit cells which are connected to each other in parallel, wherein the unit cell includes a unit transistor pair, which is formed as a differential structure, and a ballast resistor which is connected to a common emitter of the unit transistor pair; extracting the electrical characteristics by a half amplifier pattern which is formed as one side differential transistors of unit cells and emitter ballast resistors are connected to one another in parallel and modeling a differential amplifier as a single differential amplifier of a unit cell based on the extracted values which are obtained through the half amplifier pattern.

7. A method for extracting emitter resistance and parasitic components of a differential amplifier comprising a plurality of unit cells which are connected to each other in parallel, wherein the unit cell includes a unit transistor pair, which is formed as a differential structure, and a ballast resistor which is connected to a common emitter of the unit transistor pair,
   the method comprising the steps of: preparing a differential amplifier comprising a plurality of unit cells which are connected to each other in parallel, wherein the unit cell includes a unit transistor pair, which is formed as a differential structure, and a ballast resistor which is connected to a common emitter of the unit transistor pair; extracting the emitter resistance and parasitic components by a total common emitter ballast resistor pattern which is formed as emitter ballast resistors of the unit cells are connected to each other in parallel and modeling a differential amplifier as a single differential amplifier of a unit cell based on the extracted values which are obtained through the total common emitter ballast resistor pattern.

8. A method for extracting emitter resistance and parasitic components of a differential amplifier comprising a plurality of unit cells which are connected to each other in parallel, wherein the unit cell includes a unit transistor pair, which is formed as a differential structure, and a ballast resistor which is connected to a common emitter of the unit transistor pair,
   the method comprising the steps of: preparing a differential amplifier comprising a plurality of unit cells which are connected to each other in parallel, wherein the unit cell includes a unit transistor pair, which is formed as a differential structure, and a ballast resistor which is connected to a common emitter of the unit transistor pair; extracting the emitter resistance and parasitic components via a unit emitter ballast resistor pattern serving as an emitter ballast resistor of the unit cell and modeling a differential amplifier as a single differential amplifier of a unit cell based on the extracted values which are obtained through the unit emitter ballast resistor pattern.

* * * * *